United States Patent [19]

Siniaguine et al.

[11] Patent Number: 6,099,056

[45] Date of Patent: Aug. 8, 2000

[54] NON-CONTACT HOLDER FOR WAFER-LIKE ARTICLES

[75] Inventors: Oleg Siniaguine, San Jose, Calif.; George Steinberg, Westport, Conn.

[73] Assignee: IPEC Precision, Inc., Bethel, Conn.

[21] Appl. No.: 09/194,245

[22] PCT Filed: May 21, 1997

[86] PCT No.: PCT/US97/08626

§ 371 Date: Nov. 25, 1998

§ 102(e) Date: Nov. 25, 1998

[87] PCT Pub. No.: WO97/45862

PCT Pub. Date: Dec. 4, 1997

Related U.S. Application Data

[60] Provisional application No. 60/018,782, May 31, 1996.

[51] Int. Cl.[7] ................................................. B25J 15/06
[52] U.S. Cl. .......................................... 294/64.3; 294/64.1
[58] Field of Search .................................. 294/64.1–64.3; 269/21; 271/97, 98, 195; 406/88, 152, 153; 414/225, 737, 752, 941; 901/40

[56] References Cited

U.S. PATENT DOCUMENTS

| | | |
|---|---|---|
| 3,438,668 | 4/1969 | Olsson et al. . |
| 3,466,079 | 9/1969 | Mammel . |
| 3,517,958 | 6/1970 | Boucher et al. ................ 294/64.3 X |
| 3,523,706 | 8/1970 | Logue . |
| 3,539,216 | 11/1970 | Forcier . |
| 4,029,351 | 6/1977 | Apgar et al. . |
| 4,118,058 | 10/1978 | Rahn et al. . |
| 4,257,637 | 3/1981 | Hassan et al. . |
| 4,566,726 | 1/1986 | Correnti et al. . |
| 4,969,676 | 11/1990 | LaMagna ............................. 294/64.3 |
| 5,067,762 | 11/1991 | Akashi . |
| 5,077,888 | 1/1992 | Tokisue et al. . |
| 5,080,549 | 1/1992 | Goodwin et al. . |
| 5,169,196 | 12/1992 | Safabakhsh . |
| 5,324,155 | 6/1994 | Goodwin et al. . |
| 5,492,566 | 2/1996 | Sumnitsch . |
| 5,513,668 | 5/1996 | Sumnitsch . |

FOREIGN PATENT DOCUMENTS

| | | | |
|---|---|---|---|
| 0201240 | 11/1986 | European Pat. Off. . | |
| 211236 | 9/1987 | Japan ................................. | 294/64.3 |
| 292195 | 12/1990 | Japan ................................. | 294/64.3 |
| 238245 | 10/1991 | Japan ................................. | 294/64.3 |
| 537924 | 2/1977 | U.S.S.R. . | |
| 732198 | 5/1980 | U.S.S.R. . | |
| 748138 | 4/1956 | United Kingdom ................ | 294/64.3 |

OTHER PUBLICATIONS

IBM Technical Disclosure Bulletin; vol. 19, No. 4; Sep. 1976, "Beveled Bernoulli Head" by Cunningham et al.

IBM Technical Disclosure Bulletin; vol. 22, No. 5; Oct. 1979 "Diverted Flow Bernoulli Pick–Up Device" by Balder et al.

*Primary Examiner*—Johnny D. Cherry
*Attorney, Agent, or Firm*—Ware, Fressola, Van Der Sluys & Adolphson LLP

[57] ABSTRACT

A holder for wafer-like articles is formed by providing a platform having a wafer-like article facing surface that includes at least one annular groove therein. The annular groove has a ceiling surface therein which is provided with an opening. A gas conducting conduit is connected to the opening. A gas, which introduced into the conduit, exits the conduit through the opening. By choosing a particular orientation of the conduit relative to the annular groove, the gas exiting the opening can be caused to circulate in a clockwise or counter clockwise fashion. The circular flow of gas causes the formation of a vortex adjacent to the article facing surface. A wafer-like article may be held in a suspended state adjacent to the wafer-like article facing surface without contact by the vortex and the gas flowing between the wafer-like article and the article facing surface.

17 Claims, 6 Drawing Sheets

FIG. 8

NON-CONTACT HOLDER FOR WAFER-LIKE ARTICLES

CROSS REFERENCE TO RELATED APPLICATION

This application claims the benefit of U.S. Provisional Application Ser. No. 60/018,782, filed on May 31, 1996 and PCT International Application PCT/US97/08626, filed May 21, 1997, wherein the United States is the designated country.

BACKGROUND

1. Field of the Invention

The present invention relates to a holder for holding wafer-like articles without physical contact between the holder and the wafer-like article being held. More particularly, the present invention relates to an apparatus for holding articles through the use of a particular fluid dynamic relationship between the wafer-like article and the holder created by the structure of the holder.

2. Description of the Prior Art

The handling of wafer-like articles, such as silicon wafers, can present problems. Some prior art wafer-like article holding, apparatus have mechanical latches to hold the article in place. The mechanical latches have drawbacks such as contact between the article and the holder. The contact can cause contamination of the article as well as induce mechanical stresses in the article.

Other prior art wafer-like article holders include vacuum or electrostatic chucks. These types of holders also have drawbacks. Such drawbacks include physical contact between the holder and the article which can cause contamination and mechanical damage. Also, because some actual pre-processed articles, such as wafers, are not flat, securing such articles on a flat holder by vacuum or electrostatic means can cause mechanical stresses in the article.

U.S. Pat. No. 5,080,549 discloses a wafer handling apparatus operating under the Bernoulli principle to pick up, transport and deposit wafers. The apparatus includes a plate that has a plurality of laterally oriented outlets and a central outlet for discharging gas in a pattern sufficient to develop a low pressure environment to pick up the wafer while bathing the wafer in radially outflowing gasses to prevent intrusion and deposition of the wafer of particulate matter in suspension. The pressure differential caused by the Bernoulli principal serves to lift the wafer without any physical contact whatsoever between a wand assembly and the top or bottom surfaces of the wafer.

SUMMARY OF THE INVENTION

The present invention provides a holder for holding wafer-like articles without physical contact between the holder and the wafer-like article being held. The holder comprises a platform having an article facing surface which includes at least one annular groove therein formed by an inner wall, an outer wall and a ceiling surface between the inner and outer walls. The ceiling surface is provided with an opening. The holder further includes a gas conducting conduit which is connected to the opening in the ceiling surface of the annular groove. The gas conducting conduit is oriented relative to the opening in the ceiling surface of the annular groove so as to cause a circular flow of gas around the annular groove when a gas is flowed down the conduit and through the opening.

One object of the present invention is to provide a wafer-like article holder that avoids physical contact between the wafer-like article and the holder.

Another object of the present invention is to provide a wafer-like article holder that does not induce mechanical stress in the wafer-like article while it is being held.

The foregoing and other objects, features, and advantages will become apparent from the detailed description of the preferred embodiments invention as illustrated in the accompanying drawings.

BRIEF DESCRIPTION OF THE DRAWINGS

The drawings, which are not drawn to scale, include.

DETAILED DESCRIPTION OF THE PREFERRED EMBODIMENTS

Figure 1A:
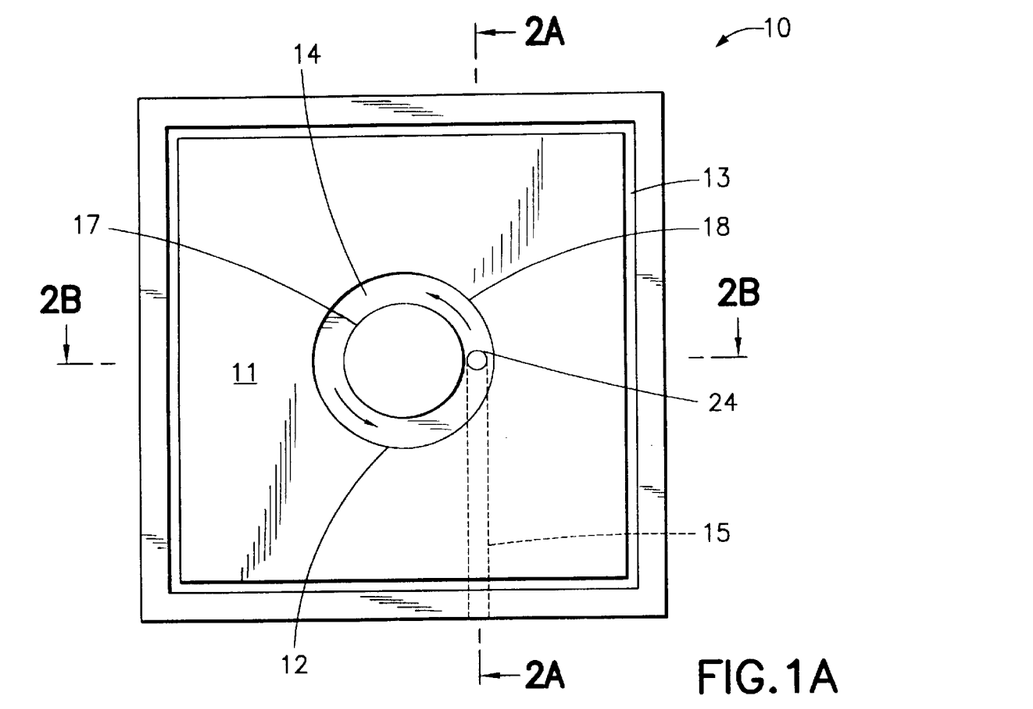
FIG. 1A, which is a diagram plan view of one embodiment of the apparatus of the present invention.
Figure 2A:
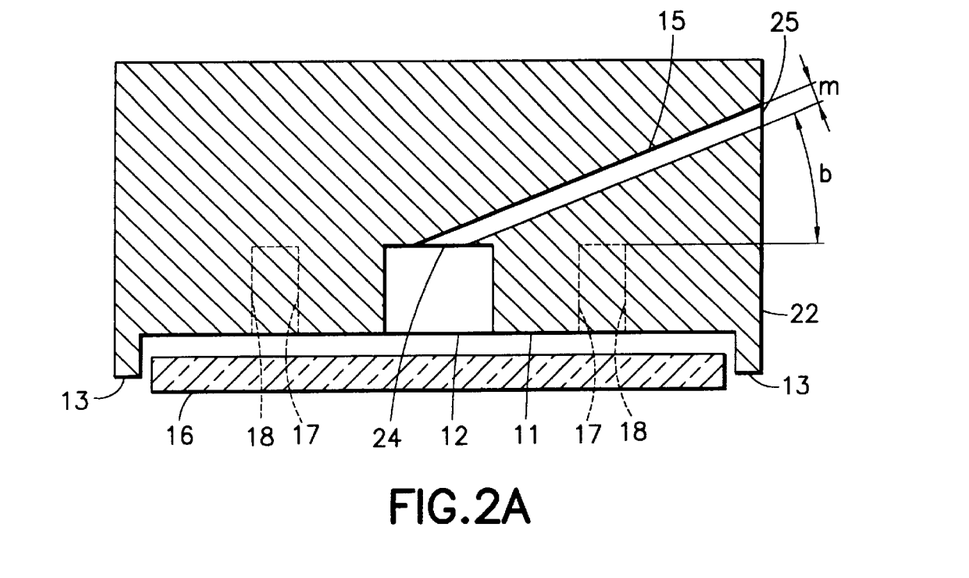
FIG. 2A, which is a sectional view of the embodiment illustrated in FIG. 1A taken along the line 2A—2A, and which also includes a wafer-like article adjacent to the apparatus.
Figure 2B:
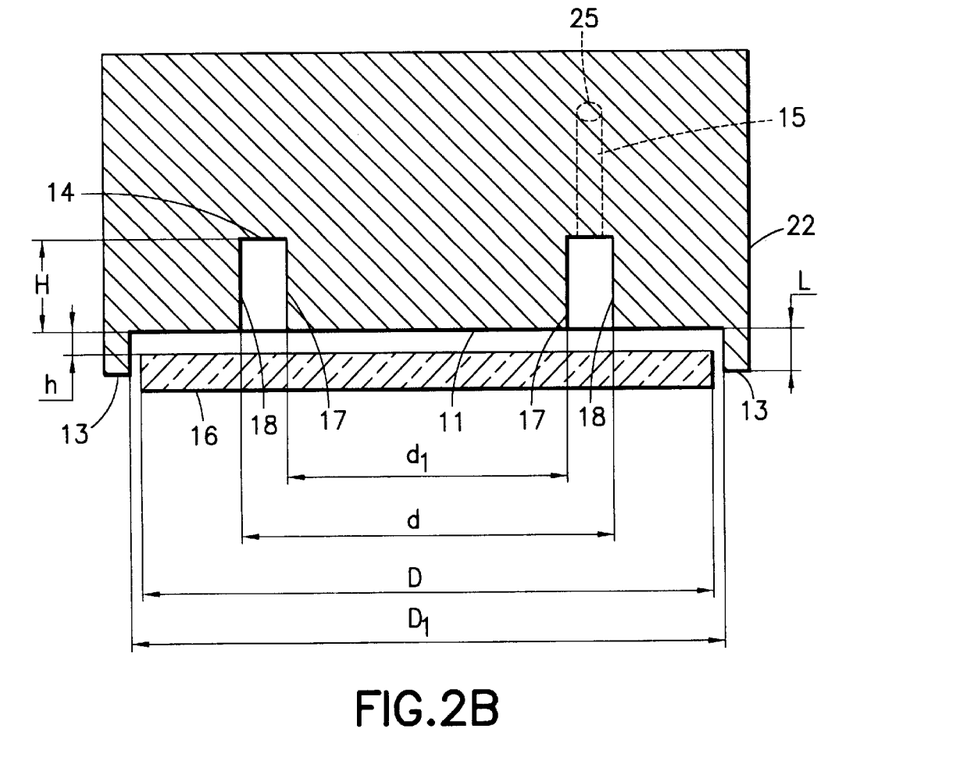
FIG. 2B, which is a sectional view of the embodiment illustrated in FIG. 1A taken along the line 2B—2B, and which also includes a wafer-like article adjacent to the apparatus.

Referring to FIGS. 1A and 2, the wafer-like article holder of the present invention comprises a platform 10 having a flat wafer-like article facing surface 11. The flat wafer-like article facing surface 11 includes at least one annular 15 groove 12 therein formed by an inner wall 17 having a diameter $d_1$, an outer wall 18 having a diameter d and a ceiling surface 14 between the inner 17 and outer 18 walls. The ceiling surface 14 is provided with an opening 24. The wafer-like article holder of the present invention may also include a rim 13 about the perimeter of the platform 10.

Still referring to FIGS. 1A and 2, a gas conducting conduit 15 having a diameter m is provided in the platform 10 between the opening 24 in the ceiling surface 14 of the annular groove 12 and a side 22 of the platform 10 at opening 25. The conduit 15 is oriented in one aspect such that a component of its axis is substantially tangential to the circumference of the annular groove 12 in the plane 25 formed by the article facing surface 11. Preferably, the ceiling surface 14 is substantially parallel planar to the plane formed by flat wafer-like article facing surface 11. The conduit 15 is also oriented in another aspect such that a component of the axis of the conduit 15 makes an angle b which is generally less than 90°, and preferably less than 45°, relative to the parallel plane formed by the ceiling surface 14 of annular groove 12. Also, preferably, the diameter m of the conduit 15 is made smaller than the annular groove's depth H.

During operation, opening 25 is connected to a source of compressed gas. The compressed gas is flowed down conduit 15 to opening 24 where it exits. Because the conduit 15 is oriented relative to opening 24 the exiting gas flows around the annular groove 12. The gas flowing around the annular groove 12 causes a vortex to be formed adjacent to the annular groove 12. As will be explained below, the gas dynamics provided by the vortex hold the wafer-like article in place without contact.

Figure 1B:
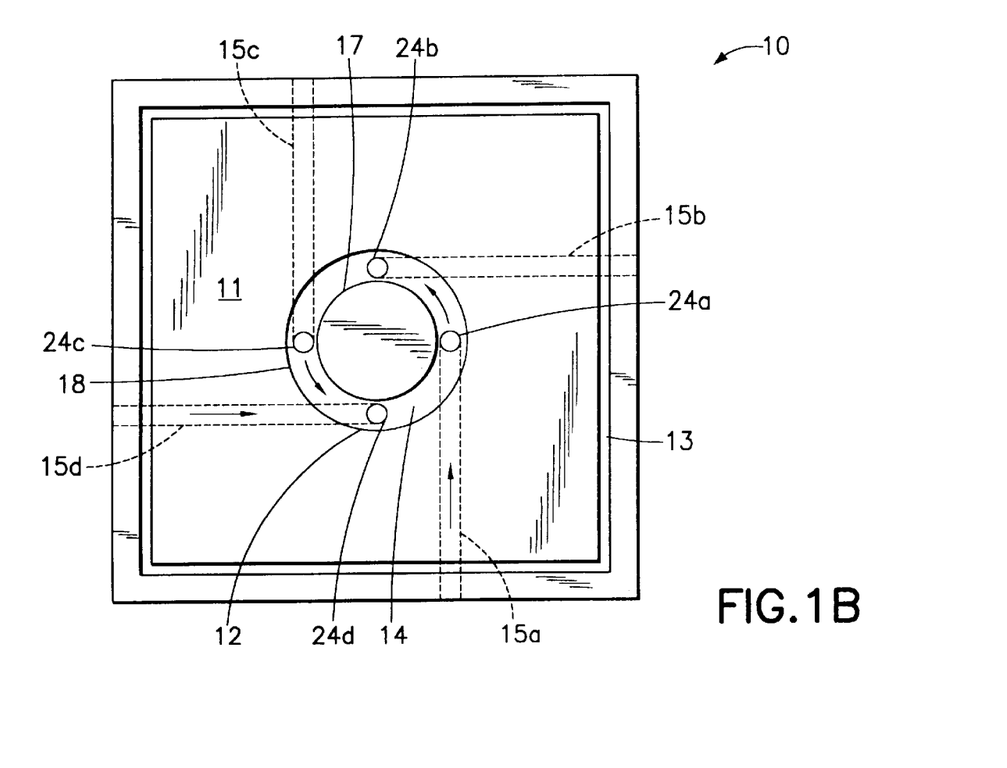
FIG. 1B, which is a diagram plan view of an alternative embodiment of the apparatus of the present invention.

Alternatively, as shown in FIG. 1B, the ceiling surface 14 of the annular groove 12 may be provided with a plurality of openings 24a–24d and a plurality of conduits 15a–15d providing a flow of compressed gas to the openings 24a–24d. Each of the conduits 15a–15d is oriented in the same manner as described above and in such a manner that each directs a flow of compressed gas out of the openings in the same direction around the annular groove 12. The advantage to having a greater number of openings 24a–24d and conduits 15a–15d is that the vortex created can be better controlled so that it has less discontinuities.

The internal diameter d, of the annular groove 12, which is established by the inner wall 17, is chosen from the ratio system:

$$d_1 < \text{minimum value of} \begin{cases} (d - 2m) \\ \left(d^2 - 4n\frac{S(m)}{\pi}\right)^{1/2} \end{cases}$$

where:
d—diameter of the outer wall 18 of the annular groove 12 which is established by the outer wall 18;
n—quantity of the openings 24 in the ceiling surface 14 of the annular groove 12; and
S(m)—cross-sectional area of the opening 24.

Through adjustments in the orientation of the gas conducting conduit 15 relative to opening 24 in the ceiling surface 14, as well as adjustments in the size of the annular groove, the gas dynamics created by the apparatus, i.e., the created vortex, can be optimized.

The wafer-like article holder of the present invention holds a wafer-like article 16 adjacent the article facing surface 11 through fluid dynamics caused by the delivery of compressed gas to opening 25. The compressed gas is directed via conduit 15 to the opening 24 in the ceiling surface 14 of the annular groove 12. The gas exits the opening 24 and moves around the annular groove 12 in either a clockwise or counter clockwise direction, depending on the orientation of the conduit 15 relative to the opening 24, and therefore, relative to annular groove 12. In either case, the clockwise or counterclockwise flowing gas forms a vortex. At the center of the vortex there is a region of relatively low pressure. As the angle b between the axis of the conduit 15 and the ceiling surface 14 of the annular groove 12 is decreased towards 0 degrees, the region of relatively low pressure caused by the vortex increases.

The diameter m of the conduit 15 should be made smaller than the depth H of the annular groove 12 to insure that the gas flows uniformly inside the annular groove 12 to create the vortex. If the annular groove's internal diameter $d_1$, established by inner wall 17 is chosen according to the ratio system (1) expressed above, such that the annular groove's cross-section (d–$d_1$) established by the inner 17 and outer 18 walls, and correspondingly the ceiling surface 14 width, is larger than area of opening 24, vortex gas velocity reduction due to annular groove-gas dynamical resistance will be minimized or avoided altogether.

By flowing gas through opening 24 according to the present invention, a wafer-like article 16 may be held in place by merely positioning the wafer-like article 16 parallel to the flat wafer-like article facing surface 11 with the gap of about 0.1–1 mm between the wafer-like article 16 and the flat wafer-like article facing surface 11. The wafer-like article will be held in place adjacent to the flat wafer-like article facing surface 11 without physically contacting it.

The gas flowing out from the annular groove 12 flows along gap h between the wafer-like article 16 and flat wafer-like article facing surface 11 and forms radial flow which is continuous around the annular groove 12 and directed out of it. As a result of the gas flow, a difference between the ambient gas pressure and the pressure in the gap h between the wafer-like article 16 and flat wafer-like article facing surface 11 is created. The typical pressure differential distribution as a function of radial distance is shown in FIG. 3.

Figure 3:
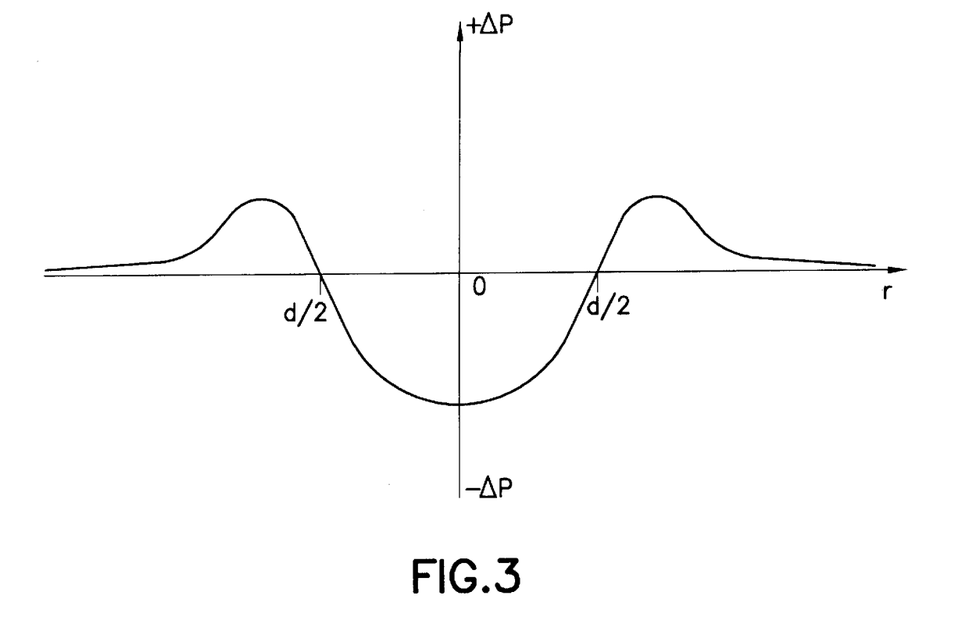
FIG. 3, which is a graph showing the relationship of the differential pressure with radial distance from the center of an annular groove in the apparatus.

Referring to FIG. 3, within a region in the annular groove 12 where r is less than d/2, the ambient gas pressure $P_a$ (e.g. atmospheric pressure) is higher than the gas pressure $P_h$ in the gap h, and the resulting pressure difference $\Delta P$ ($\Delta P = P_a - P_h$) is positive. This is the reason why the wafer-like article 16 is pressed to the wafer-like article holder 11 with force:

$$F(+) = 2\pi \int_{r=0}^{r=d/2} \Delta P(r) r \, dr$$

For a radius greater than the annular groove 12, d/2, the ambient gas pressure is lower than the gas pressure in the gap h, and the pressure difference $\Delta P$ is negative. This is the reason why the wafer-like article 16 is pushed out of the wafer-like article holder with force (see FIG. 3):

$$F(-) = 2\pi \int_{d/2}^{D/2} \Delta P(r) r \, dr$$

This force F(−) does not allow the wafer-like article 16 to touch the wafer-like article facing surface 11.

Both force values and their sum F=F(−)+F(+) depend on the gap size h. The wafer-like article equilibrium location is a gap size h where the wafer-like article weight W is compensated by the force F. Two configurations of the wafer-like article 16 with respect to the holder's surface 11 that meet the equilibrium conditions are when: (1) the wafer-like article 16 is placed below the holder surface 11: and (2) the wafer-like article 16 lies above the holder surface 11. For the first case, provided the wafer-like article's weight W is less than the maximum net positive force. $F_{max}$ of FIG. 4, the wafer-like article is drawn towards the holder surface 11 to an equilibrium position with gap h1. At this position, the downward force W is equal in magnitude and opposite in direction to the upward force supplied by the gas dynamics created by the holder. In the second case, gravity pulls the wafer-like article toward the holder surface 11 to an equilibrium position with gap h2 less than gap hi where the negative force, pushing the wafer-like article 16 away from the holder surface 11, balances the wafer-like article's weight W. Similarly, for any orientation of the wafer holder surface to the direction of gravity, there is an equilibrium gap h which the component of W normal to the holder surface 11 is balanced by a counteracting force F supplied by the holder 11. Consequently, provided there are retaining elements 13 (FIG. 2B & 8), the holder can hold the wafer-like article 16 in any orientation with no contact of the wafer-like article to the holder surface.

Figure 4:
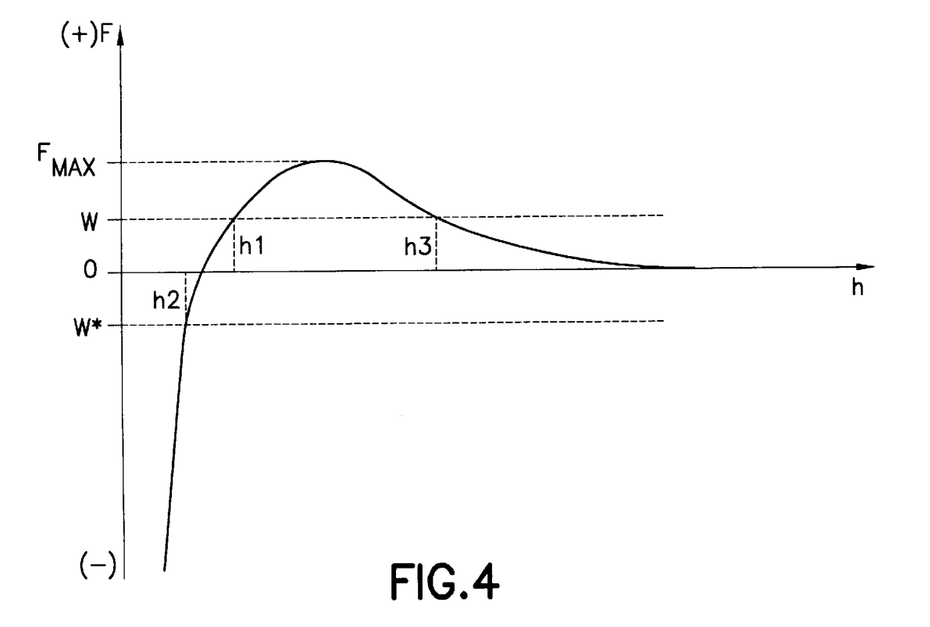
FIG. 4, which is a graph showing the relationship between holding force applied to the wafer-like article and the distance between the surface of the wafer-like article adjacent the apparatus and the apparatus.

Analyzing FIG. 4, the advantages of the wafer-like article holder of the present invention become very apparent for the case when the holder is used to suspend the wafer-like article 16 because: a) the wafer-like article equilibrium position h1 is a stable position because of small deviation of the wafer-like article's position causes counter forces to arise, that is important for reliable wafer-like article holding; b) the holder may "catch" the wafer-like article and bring it to it's equilibrium position h1 from any distance in the range between h1 and h3 where the attractive force is higher than wafer-like article's weight, which may simplify loading the wafer-like article onto the holder; and c) due to the gas gap between the wafer-like article and the holder the wafer-like article does not need to be flat or change its flatness during a treatment (thermal elastic deformation) without additional stress or degradation of holding reliability if the non-flatness magnitude is comparable with the gas gap size.

In processing applications and specifically for plasma processing applications, there may be heat input to the surface of the wafer-like article. Heat must be effectively removed so that there is not thermal degradation of the wafer-like article (e.g., damage to semiconductor IC circuits, thermally diffusing contaminants into a semiconductor wafer). Heat must be uniformly removed; otherwise, non-uniform processing for thermally dependent processes will occur (e.g., non uniform etching of a material from the wafer-like article with an etch process whose rate is temperature dependent). Consequently, the close proximity to the surface of the wafer-like article (i.e., less than 1 mm) provides efficient heat transfer across the wafer-like article to holder surface gap h. Also, because the holder's surface 11 has no large holes or discontinuities in its surface, only annular grooves which are small in size as compared to the entire surface area of surface 11, the rate of heat transfer from the wafer-like article to the holder is substantially uniform across its area.

Figure 5:
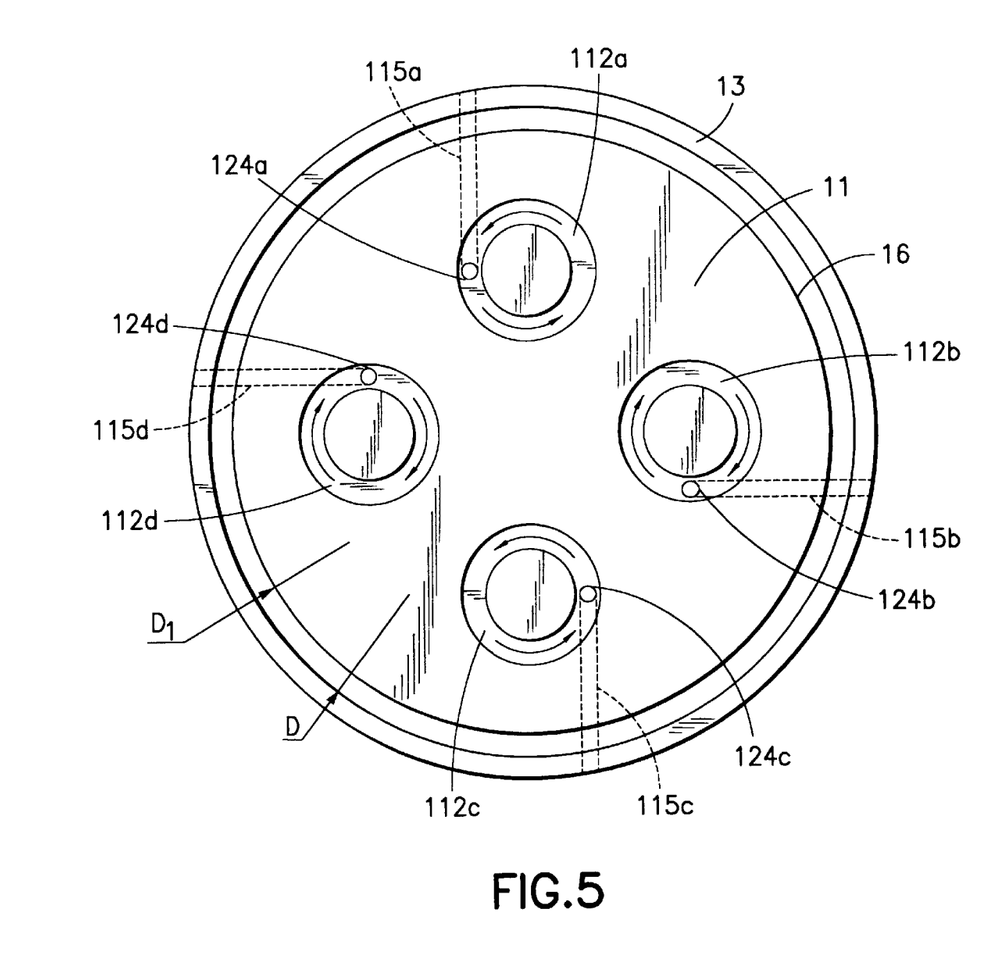
FIG. 5, which is a diagram plan view of another embodiment of the apparatus of the present invention illustrating four annular grooves.

Referring to FIG. 5, flat wafer-like article facing surface 11 may be provided with a plurality of annular grooves, such as the plurality of annular grooves 112a–112d. As illustrated in FIG. 5, when a plurality of annular grooves are employed, the quantity of annular grooves is preferably chosen in multiples of two. Each annular groove 112a–112d has a conduit 115a–115d connected to an opening 124a–124d in the ceiling surface. The conduits are connected to a source of compressed gas. Each of the conduits 115a–115d is selectively oriented in an opposite direction from a conduit of an immediately adjacent annular groove. For example, in the embodiment shown in FIG. 5, two of the annular grooves 112a and 112c, forming a first plurality of annular grooves, have openings 124a and 124c which are connected to a first plurality of gas conducting conduits, conduits 115a and 115c, which are oriented relative to the annular grooves 112a and 112c to cause a counter clockwise flow around each. The remaining two annular grooves 112b and 112d, forming a second plurality of annular grooves, have openings 124b and 124d connected to a second plurality of conduits, such as conduits 115b and 115d, which are oriented relative to the annular grooves 112b and 112d to cause a clockwise flow around each. The opposite rotation of gas in the adjacent annular grooves allows the rotational influences of the vortexes on the wafer-like article to cancel and the wafer-like article 16 does not rotate relatively the flat wafer-like article facing surface 11.

Figures 6, 7:
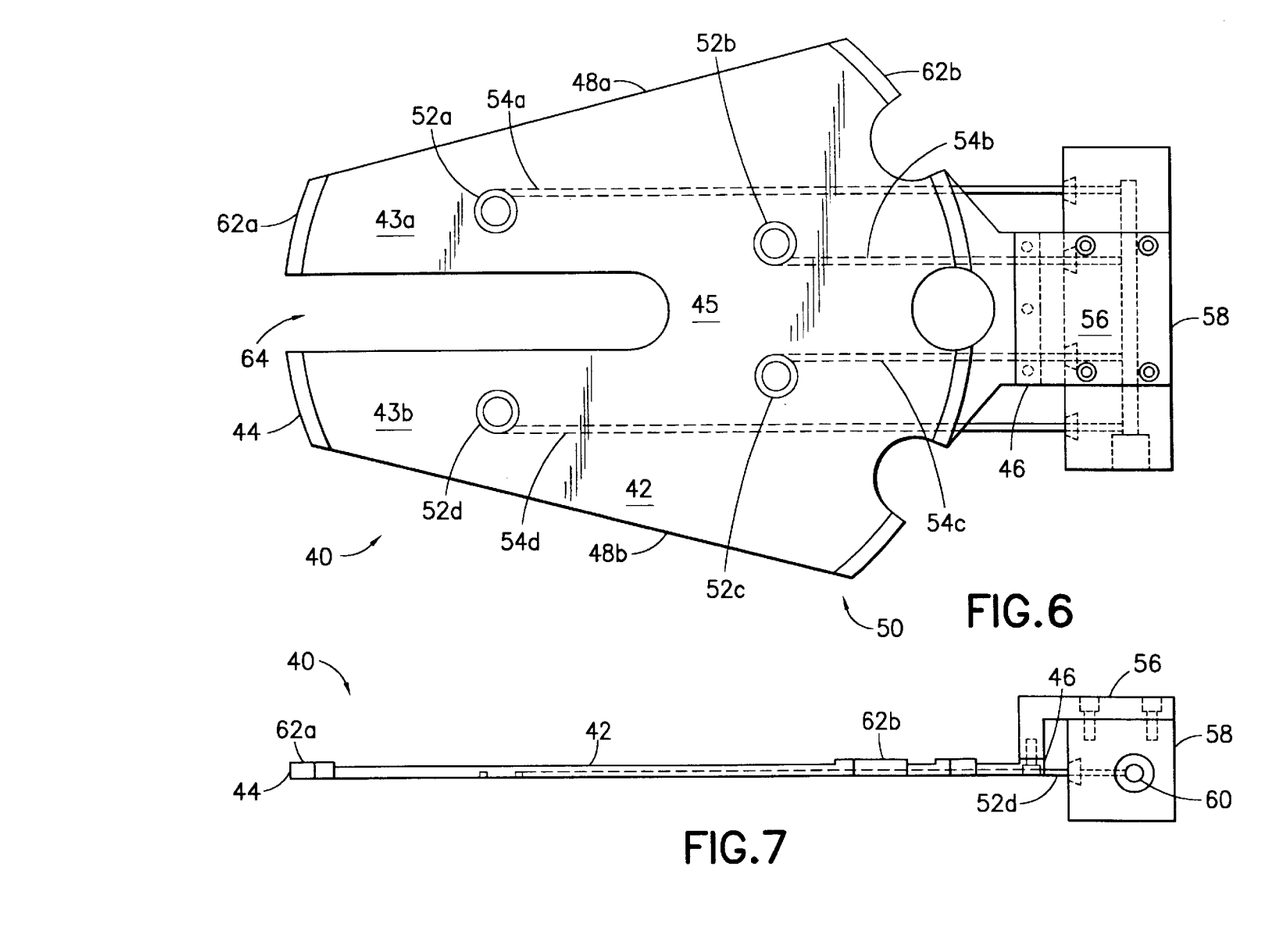
FIG. 6, which is a schematic diagram plan view of an end effector which incorporates the structure of the present invention for creating a vortex.
FIG. 7, which is a schematic diagram elevational view of the end effector shown in FIG. 6.

Referring to FIGS. 6 and 7, there is shown a fork-shaped end effector 40 for picking up, transporting and holding wafer-like articles in any orientation. With the fork-shaped end effector 40, the orientation of the wafer-like article may be changed during transport to allow, for example, removal from a station in which it is face-down and loaded into a wafer-like article holder, such as the holder described above, for processing with a face-up orientation. Also, the fork-shaped end effector 40 can be made to allow removal from and into stations with little dimensional clearance. For examples where the wafer-like article is a semi-conductor wafer or a glass plate used for lithographic exposure of semiconductor wafer patterns, standard packing is in multiple, stacked configurations with little spacing between the articles and only limited areas of open space around the article's edge. The fork-shaped end effector 40 can be made thin (e.g., less than about 2.5 mm) to fit between stacked, wafer-like articles and with lateral dimensions that fit into open space around the edges.

The end effector 40 is formed by a substantially planar thin fork-shaped platform 42 having first and second prong regions 43a–43b located at first end 44 and a base region 45 adjacent to second end 46. The platform further includes a pair of sides 48a and 48b. Preferably, the sides 48a and 48b taper outwardly from the first end 44 towards a point 50 between the first and second ends. From point 50, the sides 48a and 48b taper inwardly toward the second end 46.

An even numbered plurality of annular grooves 52a–52d are provided in the platform 42. Each of the plurality of annular grooves is constructed in a similar fashion as described above. Each has inner and outer walls and a ceiling surface which spans the inner and outer walls. The ceiling surface of each of the plurality of annular grooves is provided with an opening. The openings in half of the even numbered plurality of annular grooves, 52a & 52c, are supplied with a flow of gas by corresponding gas conducting conduits 54a & 54c, which are oriented relative to the annular grooves so as to direct the flow of gas in a counter clockwise fashion. The openings in the other half of the even numbered plurality of annular grooves 52b & 52d are supplied with a flow of gas by corresponding gas conducting conduits 54b & 54d, which are oriented relative to the annular grooves so as to direct the flow of gas in a clockwise fashion. Annular grooves 52a and 52d are provided on first and second prong regions 43a and 43b respectively. Annular grooves 52b and 52c are provided on the base region 45 of the platform 42. Gas conducting conduits 54a–54d may be made from hypodermic tubing.

The second end 46 of platform 42 is connected to extension member 56 and the extension member 56 is attached to a gas manifold 58. The gas conducting conduits 54a–54d are connected to gas manifold 58 which has inlet 60 connected to a supply of compressed gas (not shown).

Preferably, the platform is provided with first and second rim sections 62a and 62b. The first rim 62a is positioned adjacent to the first end 44, while second rim section 62b is positioned adjacent section to the second end 46. The rim sections prevent the wafer-like article from moving laterally off of the platform.

Figure 8:
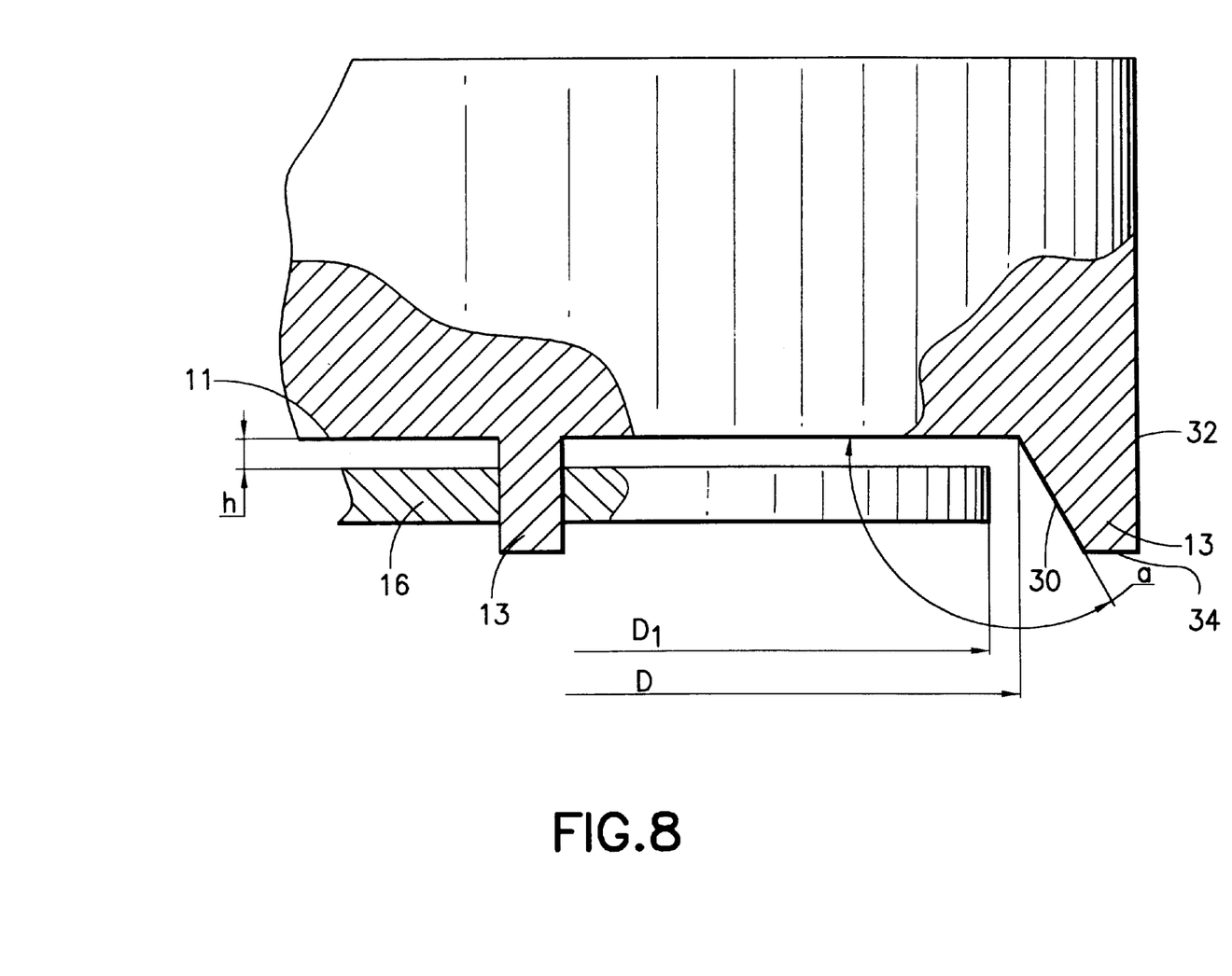
FIG. 8, which is a partial schematic diagram elevational view illustrating a rim comprised of fingers for preventing excessive lateral movement of the wafer- like article.

Referring to FIG. 8, in the embodiment of the invention illustrated in FIG. 1A, the flat wafer-like article facing surface 11 is provided with rim 13 having an is inner surface 30, an outer surface 32 and an end 34. The rim is positioned along the facing surface's perimeter or edge. The rim 13 is intended to function as a boundary to retain the wafer-like article adjacent to the flat wafer-like article facing surface 11 because the wafer-like article 16 has no mechanical contact and no friction with the wafer-like article facing surface 11 and the wafer-like article 16 could shift relative to the facing surface 11. Preferably, the end 34 of the rim 13 extends out from the article facing surface 11 by a distance L, which is typically more than 1 mm because the equilibrium gap size h is typically not more than 1 mm. While the rim 13 may be continuous along the perimeter, alternatively, the rim 13 may comprise a plurality of periodically spaced apart fingers, such as that shown in FIG. 8. The fingers make the wafer-like article's edges more open to treatment agents than a continuous rim. In a preferred embodiment, the inner surface 30 of the rim 13, or the inner surface 30 of each of the plurality of fingers comprising a rim 13, may be made to have angle a which is greater than 90° relative to the plane formed by the wafer-like article facing surface 11. The purpose of angling the rim is to reduce "shadow" effects caused by the rim 13 during treatment (as an example, plasma treatment) of the article 16.

According to the present invention, in any embodiment, such as that shown in FIGS. 1A, 1B, 5, 6 and 7, for example, the flat wafer-like article facing surface 11 is provided with dimension D which is always greater than the dimension $D_1$ of the wafer-like article 16. In other words, the wafer-like articles which may be held by the apparatus of the present invention will always have dimensions which are less than the dimensions of the article facing surface 11. The wafer-like article facing surface 11 size D should be more than the wafer-like article dimension $D_1$ to allow the wafer-like article to take it's equilibrium position without interference from the rim 13.

As will be understood from the foregoing description, according to the present invention, several embodiments of a wafer-like article holder have been described which use gas dynamics to hold the article without physical contact between the holder and the article. The present invention adequately provides a means for meeting the requirements for holding wafer-like articles for the purposes of processing the side of the wafer-like article facing away from the holder's surface, particularly with a reactive gas generated by an electrical discharge and for transporting the wafer like article. It is to be understood that the embodiments described herein are merely illustrative of the principles of the invention. Various modifications may be made thereto by persons skilled in the art which will embody the principles of the invention and fall within the spirit and scope thereof. Hence, the present invention is deemed limited only by the appended claims and the reasonable interpretation thereof.

What is claimed is:

1. A holder for holding wafer-like articles (16) without physical contact between the holder and the wafer-like article being held, the holder having a platform (10) with an article facing surface (11), the holder characterized in that the article facing surface is provided with an annular groove (12) therein having depth (H), formed by an inner wall (17), an outer wall (18) and a ceiling surface (14) between the inner and outer walls, the ceiling surface further including an opening (24) therein; and a gas conducting conduit (15), having a diameter (m) which is smaller than depth (H), is connected to the opening in the ceiling surface of the annular groove, wherein the gas conducting conduit is oriented relative to the opening in the ceiling surface of the annular groove so as to cause a circular flow of gas around the annular groove when a gas is flowed down the conduit and through the opening.

2. The holder of claim 1, wherein the gas conducting conduit (15) is oriented so as to be substantially tangential to the annular groove s circumference which is in the same plane as a plane formed by the article facing surface (11).

3. The holder of claim 2, wherein the ceiling surface (14) is substantially planar and the gas conducting conduit (15) forms an angle b with respect to the plane formed by the ceiling surface and wherein angle b is in the range of 0 to 45 degrees.

4. The holder of claim 1, wherein the ceiling surface (14) is substantially planar and the gas conducting conduit (15) forms an angle b with respect to the plane formed by the ceiling surface and wherein angle b is in the range of 0 to 45 degrees.

5. The holder of claim 1, wherein the opening (24) in the ceiling surface (14) is smaller than the ceiling surface.

6. The holder of claim 1, wherein the ceiling surface is provided with a plurality of openings (24a–24d), and wherein the holder is further provided with a plurality of gas conducting conduits (15a–15d), each of the openings being connected to a gas conducting conduit, each ot the gas conducting conduits being oriented relative to its respective opening so as to cause a circular flow of gas around the annular groove in the same direction when a gas is flowed down the conduit and through the associated opening.

7. The holder of claim 1, wherein the article facing surface (11) is provided with a rim (13) extending therefrom, the rim having an inner surface (30) which faces the annular groove, an outer surface (32) and an end (34).

8. The holder of claim 7, wherein the rim (13) is substantially continuous.

9. The holder of claim 7, wherein the rim (13) is formed from a plurality of spaced apart fingers.

10. The holder of claim 7, wherein the inner surface (30) of the rim (13) forms angle a with respect to the plane formed by the wafer-like article facing surface, and wherein angle a is greater than 90 degrees.

11. The holder of claim 1, wherein the gas conducting conduit (15) is formed from a hypodermic tube.

12. The holder of claim 1, wherein the article facing surface (11) is further provided with a second annular groove (112b) having depth (H) formed by a second inner wall, a second outer wall and a second ceiling surface between the second inner and outer walls, the second ceiling surface further including an opening (124b) therein, and a second gas conducting conduit (115b), having a diameter (M) which is smaller than depth (H), connected to the opening in the second ceiling surface of the second annular groove, wherein the second gas conducting conduit is oriented relative to the opening in the second ceiling surface of the second annular groove so as to cause a circular flow of gas around the second annular groove when a gas is flowed down the second conduit and through the opening, and wherein the circular flow of gas around the second annular groove is in a direction which is opposite to the direction of the circular flow of gas around the first annular groove.

13. The holder of claim 12, wherein the platform further includes a rim (13) extending from the article facing surface.

14. The holder of claim 12, wherein the platform (42) is fork-shaped so as to have a first prong region (43a), a second prong region (43b) and a base region (45), and wherein the first annular groove (52a) resides on the first prong region and the second annular groove (52d) resides on the second prong region.

15. The holder of claim 14. wherein the first prong region (43a), the second prong region (43b) and the base region (45) are provided with a rim (62a, 62b).

16. The holder of claim 1, wherein the article facing surface (42) is further provided with:
- a second annular groove (52b) having depth (H) formed by a second inner wall, a second outer wall and a second ceiling surface between the second inner and outer walls, the second ceiling surface further including an opening (124b) therein;
- a second gas conducting conduit (54b), having a diameter (M) which is smaller than depth (H), connected to the opening in the second ceiling surface of the second annular groove, wherein the second gas conducting conduit is oriented relative to the opening in the second ceiling surface of the second annular groove so as to cause a circular flow of gas around the second annular groove when a gas is flowed down the second conduit and through the opening, and wherein the circular flow of gas around the second annular groove is in a direction which is opposite to the direction of the circular flow of gas around the first annular groove;
- a third annular groove (52c) having depth (H) formed by a second inner wall, a second outer wall and a second ceiling surface between the second inner to and outer walls, the second ceiling surface further including an opening (124b) therein;
- a third gas conducting conduit (54c), having a diameter (M) which is smaller than depth (H), connected to the opening in the second ceiling surface of the second annular groove, wherein the second gas conducting conduit is oriented relative to the opening in the second ceiling surface of the second annular groove so as to cause a circular flow of gas around the second annular groove when a gas is flowed down the second conduit and through the opening, and wherein the circular flow of gas around the second annular groove is in a direction which is the same as the direction of the circular flow of gas around the first annular groove;
- a fourth annular groove (52d) having depth (H) formed by a second inner wall, a second outer wall and a second ceiling surface between the second inner and outer walls, the second ceiling surface further including an opening (124b) therein;
- a fourth gas conducting conduit (54d), having a diameter (M) which is smaller than depth (H), connected to the opening in the second ceiling surface of the second annular groove, wherein the second gas conducting conduit is oriented relative to the opening in the second ceiling surface of the second annular groove so as to cause a circular flow of gas around the second annular groove when a gas is flowed down the second conduit and through the opening, and wherein the circular flow of gas around the second annular groove is in a direction which is opposite to the direction of the circular flow of gas around the first annular groove:
- wherein the platform is fork-shaped so as to have a first prong region (43a), a second prong region (43b) and a base region (45); and
- wherein the first annular groove (52a) resides on the first prong region, the second annular groove (53d) resides on the second prong region and the third and fourth annular grooves (53b, 53c) reside on the base region.

17. The holder of claim 16, wherein the first prong region (43a), the second prong region (43b) and the base region (45) are provided with a rim (62a, 62b).

* * * * *

UNITED STATES PATENT AND TRADEMARK OFFICE
CERTIFICATE OF CORRECTION

PATENT NO. : 6,099,056
DATED : August 8, 2000
INVENTOR(S) : Oleg Siniaguine and George Steinberg It is certified that error appears in the above-identified patent and that said Letters Patent is hereby corrected as shown below:

Column 1,
Line 24, after "holding", "," should be deleted.

Column 2,
Line 63, after "plane", "25" should be deleted.

Column 3,
Line 27, "d," should be -- $d_1$ --.

Column 4,
Line 57, after "force", "." should be -- , --.
Line 64, "hi" should be -- h1 --.

Column 5,
Line 5, "(Fig. 2B & 8)" should be -- Fig. 2B & 8 --.

Claims,
Column 8, claim 3,
Line 5, "2" should be -- 1 --.

Column 8, claim 4,
Line 9, "1" should be -- 2 --.

Column 8, claim 13,
Line 58, "13" should be -- 30 --.

Signed and Sealed this

Thirteenth Day of November, 2001

Attest:

NICHOLAS P. GODICI
*Acting Director of the United States Patent and Trademark Office*

*Attesting Officer*